(12) United States Patent
Motonari et al.

(10) Patent No.: US 7,087,530 B2
(45) Date of Patent: Aug. 8, 2006

(54) AQUEOUS DISPERSION FOR CHEMICAL MECHANICAL POLISHING

(75) Inventors: Masayuki Motonari, Tokyo (JP); Masayuki Hattori, Tokyo (JP); Nobuo Kawahashi, Tokyo (JP)

(73) Assignees: JSR Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 10/689,680

(22) Filed: Oct. 22, 2003

(65) Prior Publication Data

US 2004/0144755 A1 Jul. 29, 2004

Related U.S. Application Data

(63) Continuation of application No. 09/816,397, filed on Mar. 26, 2001, now abandoned.

(30) Foreign Application Priority Data

Mar. 27, 2000 (JP) ............................. 2000-87015

(51) Int. Cl.
*H01L 21/302* (2006.01)

(52) U.S. Cl. .................. 438/693; 438/695; 438/697

(58) Field of Classification Search ............... 438/692, 438/693, 695, 697; 451/41
See application file for complete search history.

(56) References Cited

U.S. PATENT DOCUMENTS

| | | | |
|---|---|---|---|
| 5,690,539 A | 11/1997 | Swidler et al. | |
| 5,738,800 A | 4/1998 | Hosali et al. | |
| 5,756,398 A | 5/1998 | Wang et al. | |
| 5,770,095 A | 6/1998 | Sasaki et al. | |
| 5,814,687 A | 9/1998 | Kasai et al. | |
| 5,876,490 A * | 3/1999 | Ronay ............................ | 106/3 |
| 5,954,997 A | 9/1999 | Kaufman et al. | |
| 5,967,964 A | 10/1999 | Hattori et al. | |
| 5,990,012 A * | 11/1999 | Robinson et al. ........... | 438/692 |
| 6,063,306 A | 5/2000 | Kaufman et al. | |
| 6,068,769 A | 5/2000 | Iio et al. | |
| 6,126,853 A | 10/2000 | Kaufman et al. | |
| 6,136,714 A | 10/2000 | Schutz | |
| 6,217,416 B1 * | 4/2001 | Kaufman et al. ............. | 451/41 |
| 6,383,240 B1 | 5/2002 | Nishimoto et al. | |
| 6,416,685 B1 * | 7/2002 | Zhang et al. ............... | 252/79.1 |
| 6,420,269 B1 * | 7/2002 | Matsuzawa et al. ........ | 438/693 |
| 6,447,563 B1 * | 9/2002 | Mahulikar .................... | 51/309 |
| 6,447,695 B1 | 9/2002 | Motonari et al. | |
| 6,454,819 B1 | 9/2002 | Yano et al. | |
| 6,689,692 B1 * | 2/2004 | Grover et al. .............. | 438/691 |

FOREIGN PATENT DOCUMENTS

| | | |
|---|---|---|
| EP | 0 846 742 | 6/1998 |
| EP | 1 077 240 | 2/2001 |
| EP | 1 104 778 | 6/2001 |
| JP | 4-291722 | 10/1992 |
| JP | 4-291723 | 10/1992 |
| JP | 4-291724 | 10/1992 |
| JP | 8-510437 | 11/1996 |
| JP | 9-82668 | 3/1997 |
| JP | 10-44047 | 2/1998 |
| JP | 10-46140 | 2/1998 |
| JP | 10-116804 | 5/1998 |
| JP | 1-270447 | 10/1998 |
| JP | 10-279928 | 10/1998 |
| JP | 11-40526 | 2/1999 |
| JP | 11-135466 | 5/1999 |
| WO | 94/28194 | 12/1994 |
| WO | WO 99/64527 | 12/1999 |

OTHER PUBLICATIONS

Elastic Modulus, http://www.mse.cornell.edu/courses/engri111/modulus.htm Cornell University, 1996.*

* cited by examiner

*Primary Examiner*—Nadine G. Norton
*Assistant Examiner*—Binh X. Tran
(74) *Attorney, Agent, or Firm*—Oblon, Spivak, McClelland, Maier & Neustadt, P.C.

(57) ABSTRACT

The invention provides an aqueous dispersion for chemical mechanical polishing that can limit scratches of a specific size to a specific number, even with interlayer insulating films with small elastic moduli (silsesquioxane, fluorine-containing $SiO_2$, polyimide-based resins, and the like.). When using the aqueous dispersion for chemical mechanical polishing of an interlayer insulating film with an elastic modulus of no greater than 20 GPa as measured by the nanoindentation method, the number of scratches with a maximum length of 1 µm or greater is an average of no more than 5 per unit area of 0.01 $mm^2$ of the polishing surface. An aqueous dispersion for CMP or an aqueous dispersion for interlayer insulating film CMP according to another aspect of the invention contains a scratch inhibitor agent and an abrasive. The scratch inhibitor may be biphenol, bipyridyl, 2-vinylpyridine, salicylaldoxime, o-phenylenediamine, catechol, 7-hydroxy-5-methyl-1,3,4-triazaindolizine, and the like. The abrasive may consist of inorganic particles, organic particles or organic/inorganic composite particles. The organic/inorganic composite particles may be formed by polycondensation of an alkoxysilane, aluminum alkoxide, titanium alkoxide, and the like in the presence of polymer particles of polystyrene or the like, and bonding of polysiloxane, and the like, on at least the surface of the polymer particles.

14 Claims, No Drawings

US 7,087,530 B2

AQUEOUS DISPERSION FOR CHEMICAL MECHANICAL POLISHING

CROSS REFERENCE TO RELATED APPLICATIONS

This application is a continuation of Ser. No. 09/816,397 filed on Mar. 26, 2001, now abandoned.

BACKGROUND OF THE INVENTION

1. Field of the Invention

The present invention relates to an aqueous dispersion for chemical mechanical polishing. More specifically, the present invention relates to an aqueous dispersion that is useful when soft interlayer insulating films with a small elastic modulus are used in chemical mechanical polishing (hereunder referred to as "CMP") of wiring pattern-formed wafers during the manufacture of semiconductor devices.

2. Prior Art

Aqueous dispersions comprising inorganic particles of colloidal silica, colloidal alumina or the like have been commonly used in the prior art as polishing agents for CMP of working films and interlayer insulating films during the manufacture of semiconductor devices. However, since such aqueous dispersions have low dispersion stability and tend to aggregate, scratches are generated on polishing surfaces by aggregated masses, and this results in lower yields. In order to solve this problem there have been proposed various methods including (1) uniform dispersion using a homogenizer and (2) removal of the aggregated masses with a filter. However, these methods fail to improve the polishing agents themselves, while also introducing new problems such as a lower polishing rate.

In recent years, more attention is being focused on achieving lower permittivities of interlayer insulation films for the purpose of improving VLSI performance. Lower permittivities have been achieved by the development of interlayer insulation films comprising, in place of $SiO_2$ films with high permittivities, silsesquioxane (permittivity: approximately 2.6–3.0), fluorine-containing $SiO_2$ (permittivity: approximately 3.3–3.5), polyimide-based resins (permittivity: approximately 2.4–3.6, trade name "PIQ" by Hitachi Chemical Industries Co., Ltd.; trade name "FLARE" by Allied Signal Corp., and the like), benzocyclobutene (permittivity: approximately 2.7, trade name "BCB" by Dow Chemical Corp., and the like.), hydrogen-containing SOG (permittivity: approximately 2.5–3.5) and organic SOG (permittivity: approximately 2.9, trade name "HSGR7" by Hitachi Chemical Industries Co., Ltd.) and the like. However, because these insulating films have low mechanical strength and are soft and brittle compared to $SiO_2$ films, they sometimes produce large scratches with such conventional aqueous dispersions comprising inorganic particles. Numerous scratches of various shapes are also produced in some cases.

SUMMARY OF THE INVENTION

It is an object of the present invention to overcome the aforementioned problems of the prior art by providing an aqueous dispersion for chemical mechanical polishing that can limit scratches of a specific size to a specific number, even with interlayer insulating films with small elastic moduli.

The aqueous dispersion for chemical mechanical polishing according to a first aspect of the invention is characterized in that for chemical mechanical polishing of an interlayer insulating film with an elastic modulus of no greater than 20 GPa as measured by the nanoindentation method, the number of scratches with a maximum length of 1 μm or greater is an average of no more than 5 per unit area of 0.01 $mm^2$ of the polishing surface.

According to the invention, the interlayer insulating film may be silsesquioxane, fluorine-containing $SiO_2$, a polyimide-based resin or benzocyclobutene.

According to the invention, the number of scratches with a maximum length of 1 μm or greater is preferably an average of no more than 3 per unit area of 0.01 $mm^2$ of the polishing surface.

The aqueous dispersion for chemical mechanical polishing according to a second aspect of the present invention is characterized by comprising a scratch inhibitor and an abrasive.

The aqueous dispersion for chemical mechanical polishing of interlayer insulating films according to a third aspect of the present invention is characterized by comprising a scratch inhibitor and an abrasive.

The aforementioned second and third aspects of the invention may also be specified as follows.

1. The scratch inhibitor is at least one from among (1) biphenol, (2) bipyridyl, (3) 2-vinylpyridine and 4-vinylpyridine, (4) salicylaldoxime, (5) o-phenylenediamine and m-phenylenediamine, (6) catechol, (7) o-aminophenol, (8) thiourea, (9) an N-alkyl group-containing (meth)acrylamide, (10) an N-aminoalkyl group-containing (meth)acrylamide, (11) a heterocyclic compound with a heteropentacycle and with no aromatic ring forming the skeleton, (12) a heterocyclic compound with a heteropentacycle and with an aromatic ring forming the skeleton, (13) phthalazine, (14) a compound with a heterohexacycle bearing three nitrogen atoms, and a derivative of any of compounds (1) through (14).

2. The scratch inhibitor is a surfactant.

3. The scratch inhibitor is 7-hydroxy-5-methyl-1,3,4-triazaindolizine.

4. The abrasive consists of inorganic particles, organic particles or organic/inorganic composite particles.

5. The organic/inorganic composite particles are formed by polycondensation of an alkoxysilane, aluminum alkoxide, titanium alkoxide or the like in the presence of polymer particles of polystyrene, polymethyl methacrylate or the like, and bonding of polysiloxane or the like on at least the surface of the polymer particles.

6. The organic/inorganic composite particles have organic particles and inorganic particles with zeta potentials of opposite signs bonded by electrostatic force.

7. It further comprises an oxidizing agent.

8. The oxidizing agent is hydrogen peroxide.

9. It further comprises an organic acid.

Further, the aforementioned third aspects of the invention may also be specified as follows.

1. For chemical mechanical polishing of an interlayer insulating film with an elastic modulus of no greater than 20 GPa as measured by the nanoindentation method, the number of scratches with a maximum length of 1 μm or greater is an average of no more than 5 per unit area of 0.01 $mm^2$ of the polishing surface.

2. Interlayer insulating film is silsesquioxane, fluorine-containing $SiO_2$, a polyimide-based resin or benzocyclobutene.

According to the invention, it is possible to obtain an aqueous dispersion that limits the number of scratches with a maximum length of 1 μm or greater to an average of no more than 5 per unit area of 0.01 $mm^2$ of the polishing surface, for chemical mechanical polishing of interlayer insulating films with small elastic moduli.

DETAILED DESCRIPTION OF THE INVENTION

The aqueous dispersion for chemical mechanical polishing of the present invention is characterized in that for chemical mechanical polishing of an interlayer insulating film with an elastic modulus of no greater than 20 GPa as measured by the nanoindentation method, the number of scratches with a maximum length of 1 μm or greater is an average of no more than 5 per unit area of 0.01 mm$^2$ of the polishing surface.

The "elastic modulus" may be up to 10 GPa, but it is preferably no greater than 5 GPa.

The elastic modulus may be determined using the UMIS-2000 nanoindenter by CSIRO, described in "Principles and Application of Nanoindentation Methods", NON-DESTRUCTIVE TESTING, Vol. 47, No. 6 (1998), pp. 358–363, under "4. Principle and application of nanoindentation" and "4.1 Nanoindenter structure", according to the method described under "4.2 Nanoindentation method using sharp angle indentation", or the method described under "4.3 Nanoindentation method using dome-shaped indentation".

The number of scratches may be evaluated, for example, by chemical mechanical polishing under the following conditions.

Load: 0.03 MPa, Table rotation speed: 50 rpm, Head rotation speed: 50 rpm, Aqueous dispersion supply rate: 150 ml/min, Polishing time: 1 min, Polishing pad: porous polyurethane As the "interlayer insulating film" there may be mentioned interlayer insulating films comprising silsesquioxane (permittivity: approximately 2.6–3.0), fluorine-containing SiO$_2$ (permittivity: approximately 3.3–3.5), polyimide-based resins (permittivity: approximately 2.4–3.6) and benzocyclobutene (permittivity: approximately 2.7). As interlayer insulating films composed mainly of silsesquioxane there may be mentioned those with a film thickness of 0.2–20 μm, a density of 0.3–1.85 g/cm$^3$ and exhibiting porosity with fine pores of a diameter of no greater than 100 nm.

When the aqueous dispersion of the invention is used for polishing of these insulating films under the conditions described in the invention of the first aspect, the number of scratches with a maximum length of 1 μm or greater can be limited to no more than an average of 5 per unit area of 0.01 mm$^2$ of the polishing surface, for example, a 100×100 μm square region. There is no restriction on the shapes the scratches may take, but one possible shape is a long, thin groove, in which case the length thereof constitutes the maximum length.

When the aqueous dispersion contains a scratch inhibitor and an abrasive and is used for chemical mechanical polishing of an interlayer insulating film with an elastic modulus of no greater than 20 GPa as measured by the nanoindentation method, the number of scratches with a maximum length of 1 μm or greater generated on the polishing surface can be limited to an average of no more than 5 per specified unit area of the polishing surface, and therefore this is particularly preferred.

The presence of scratches may be visually observed, and quantitative measurement of the size and number thereof may be carried out by observation with a light microscope or scanning electron microscope, and analysis of a photograph taken thereof. There may also be used a special apparatus that examines the state of the surface, to allow a count of the total number of scratches produced on the polishing surface.

The present invention clearly specifies the use of a "scratch inhibitor" as a component of the aqueous dispersion.

As scratch inhibitors there may be used at least one from among (1) biphenol, (2) bipyridyl, (3) 2-vinylpyridine and 4-vinylpyridine, (4) salicylaldoxime, (5) o-phenylenediamine and m-phenylenediamine, (6) catechol, (7) o-aminophenol, (8) thiourea, (9) an N-alkyl group-containing (meth)acrylamide, (10) an N-aminoalkyl group-containing (meth)acrylamide, (11) a heterocyclic compound with a heteropentacycle and with no aromatic ring forming the skeleton, (12) a heterocyclic compound with a heteropentacycle and with an aromatic ring forming the skeleton, (13) phthalazine, (14) a compound with a heterohexacycle bearing three nitrogen atoms, (15) a surfactant, and a derivative of any of compounds (1) through (14). As derivatives there may be mentioned these compounds to which are bonded short-chain alkyl groups of 1 to 3 carbons, amino groups, hydroxyl groups, mercapto groups and the like.

These scratch inhibitors may also comprise any desired combinations of two or more from among the compounds of (1) through (14) and their derivatives, and the surfactant of (15).

As heterocyclic compounds with a heteropentacycle and with an aromatic ring forming the skeleton, there may be mentioned 7-hydroxy-5-methyl-1,3,4-triazaindolizine, 3H-1,2,3-triazolo[4,5-b]pyridin-3-ol, 1H-tetrazole-1-acetic acid, 1-(2-dimethylaminoethyl)-5-mercaptotetrazole, bismuthiol, 4,5-dicyanoimidazole, adenine, 1-phenyl-5-mercapto-1H-tetrazole, 3-mercapto-1,2,4-triazole, 2-amino-4,5-dicyano-1H-imidazole, 4-amino-1,2,4-triazole, 5-amino-1H-tetrazole, 2-mercaptothiazoline, guanine, 1-phenyl-5-mercapto-1H-tetrazole, 4-amino-3-hydrazino-5-mercapto-1,2,4-triazole, 3-mercapto-4-methyl-4H-1,2,4-triazole, 1H-tetrazole and the like.

As heterocyclic compounds with a heteropentacycle and with an aromatic ring forming the skeleton, there may be mentioned benzotriazoles such as 5-methyl-1H-benzotriazole, tolyltriazole, benzimidazole, benzofloxane, 2,1,3-benzothiadiazole, 2-mercaptobenzothiazole, 2-mercaptobenzothiadiazole, 2-mercaptobenzooxazole, 2-aminobenzothiazole, 2-mercaptobenzothiazole, 2-amino-6-methylbenzothiazole and the like.

As compounds with a heterohexacycle bearing three nitrogen atoms there may be mentioned, melamine, 3-amino-5,6-dimethyl-1,2,4-triazine, 2,4-diamino-6-diallylamino-1,3,5-triazine, benzoguanamine and thiocyanuric acid.

Among these are preferred 7-hydroxy-5-methyl-1,3,4-triazaindolizine, 3-mercapto-1,2,4-triazole, 1-phenyl-5-mercapto-1H-tetrazole and 5-methyl-1H-benzotriazole because of their superior effect of reducing scratches, and 7-hydroxy-5-methyl-1,3,4-triazaindolizine is particularly preferred because of its notable effect of reducing scratches.

The content of the scratch inhibitor comprising these compounds (1) through (14) or their derivatives is preferably 0.001–5 wt %, preferably 0.005–2 wt % and even more preferably 0.01–1 wt %. If the content is less than 0.001 wt % the generation of scratches may not be sufficiently reduced, and if it exceeds 5 wt % the scratch inhibitor may not dissolve sufficiently and may tend to precipitate.

As surfactants there may be used cationic surfactants, anionic surfactants or non-ionic surfactants. As cationic surfactants there may be mentioned fatty amines, aliphatic ammonium salts and the like. As anionic surfactants there may be mentioned carboxylic acid salts such as fatty acid soaps and alkylether carboxylic acid salts, sulfonic acid salts such as alkylbenzenesulfonic acid salts, alkylnaphthalenesulfonic acid salts and α-olefinsulfonic acid salts, sulfuric acid ester salts such as higher alcohol sulfuric acid ester salts and alkylether sulfuric acid salts, and phosphoric acid esters such as alkylphosphoric acid esters and the like.

Particularly preferred as surfactants are non-ionic surfactants because of their notable effect of reducing scratches. As non-ionic surfactants there may be mentioned ethers such as polyoxyethylene alkyl ether, ether esters such as polyoxyethylene ethers of glycerin esters, and esters such as polyethylene glycol fatty acid esters, glycerin esters, sorbitan esters and the like.

The content of the surfactant in the scratch inhibitor comprising a surfactant may be 0.0001–0.1 wt %, preferably 0.0005–0.05wt % and more preferably 0.001–0.01 wt %, especially for a non-ionic surfactant. If the surfactant content is less than 0.0001 wt %, the generation of scratches may not be sufficiently reduced, and if it exceeds 0.1 wt % there may be a tendency toward lower heat resistance and coloring resistance of the organic particles.

The "abrasive" used for the present invention may be inorganic particles, organic particles or organic/inorganic composite particles.

As inorganic particles there may be used particles composed of silicon or metal oxides such as silica, alumina, ceria, titania, zirconia, iron oxide, manganese oxide or the like.

As organic particles there may be used particles composed of thermoplastic resins such as (1) polystyrene and styrene-based copolymers, (2) (meth)acrylic resins such as polymethyl methacrylate, and acrylic-based copolymers, (3) polyvinyl chloride, polyacetals, saturated polyesters, polyamides, polyimides, polycarbonates and phenoxy resins, and (4) polyolefins such as polyethylene, polypropylene, poly-1-butene, poly-4-methyl-1-pentene, and olefin-based copolymers.

Also, the organic particles, a polymer with a crosslinked structure obtained by copolymerization of styrene, methyl methacrylate or the like with divinylbenzene, ethyleneglycol dimethacrylate or the like may also be used. The degree of crosslinking can be used to adjust the hardness of the organic particles.

There may also be used organic particles composed of thermosetting resins such as phenol resins, urethane resins, urea resins, melamine resins, epoxy resins, alkyd resins and unsaturated polyester resins.

These inorganic particles and organic particles may be used alone or in combinations of two or more.

Organic/inorganic composite particles may also be used as the abrasive. The organic/inorganic composite particles may have the organic particles and inorganic particles formed integrally to an extent so as not to easily separate during the polishing process, and there are no particular restrictions on their types or structures.

As composite particles there may be used particles formed by polycondensation of an alkoxysilane, aluminum alkoxide, titanium alkoxide or the like in the presence of polymer particles of polystyrene, polymethyl methacrylate or the like, and bonding of polysiloxane or the like on at least the surface of the polymer particles. The resulting polycondensate may be directly bonded to the functional group of the polymer particles, or it may be bonded via a silane coupling agent or the like.

The polycondensate does not necessarily need to be chemically bonded to the polymer particles, and the three-dimensionally formed polycondensate may by physically held on the surface of the polymer particles. Silica particles or alumina particles may also be used instead of an alkoxysilane. These may also be held by intertwining with the polysiloxane, or they may be chemically bonded to the polymer particles by their functional groups, such as hydroxyl groups.

In an aqueous dispersion containing organic particles and inorganic particles with zeta potentials of opposite signs, the composite particles used may have their particles bonded by electrostatic force.

The zeta potentials of polymer particles are usually negative across the entire pH range, or across a wide pH range except for the low pH range; however, by using polymer particles with carboxyl groups, sulfonic acid groups or the like, it is possible to obtain polymer particles with a more definite negative zeta potential. Polymer particles with amino groups and the like have a positive zeta potential in specific pH ranges.

However, the zeta potentials of inorganic particles are highly pH-dependent and have an isoelectric point at which the potential is zero; the sign of the zeta potential reverses at around that point.

Thus, by combining specific organic particles and inorganic particles and mixing them in a pH range at which their zeta potentials are opposite signs, it is possible to form an integral composite of the organic particles and inorganic particles by electrostatic force. During the mixing, the zeta potentials may be of the same sign, and the pH adjusted thereafter to give zeta potentials of opposite signs, thereby allowing integration of the organic particles and inorganic particles.

The composite particles used may be prepared by polycondensation of an alkoxysilane, aluminum alkoxide, titanium alkoxide or the like in the presence of particles integrally composed in this manner by electrostatic force, and bonding of polysiloxane or the like on at least the surface of the particles to form a composite.

The composite particles used may be of one type, or they may be a combination of two or more types. The composite particles may also be used in combination with either or both inorganic particles and organic particles.

The mean particle size of the inorganic particles and organic particles is preferably 0.001–3 μm. A mean particle size of less than 0.001 μm will not give an aqueous dispersion with a sufficiently high removal rate. On the other hand, a mean particle size of greater than 3 μm may result in precipitation and separation of the abrasive, hampering efforts to achieve a stable aqueous dispersion. The mean particle size is more preferably 0.005–1.0 μm, and even more preferably 0.01–0.5 μm. An abrasive with a mean particle size in this range can give a stable aqueous dispersion for chemical mechanical polishing that allows polishing at a sufficient removal rate without precipitation and separation of the particles. The mean particle size may be measured by observation under a transmission electron microscope.

The abrasive content may be 0.1–20 parts by weight (hereunder referred to simply as "parts"), but is preferably 0.3–15 parts and more preferably 0.5–10 parts, to 100 parts of the aqueous dispersion. If the abrasive content is less than 0.1 part it may not be possible to achieve a sufficient removal rate, while its content is preferably not more than 20 parts because the cost will be increased and the stability of the aqueous dispersion will be reduced.

The form of the inorganic particles, organic particles and composite particles functioning as the abrasive is preferably spherical. Here, "spherical" means roughly spherical with no acute angle portions, and not necessarily near-perfect spheres. Using a spherical abrasive will allow polishing at an adequate rate, with no scratching of the polishing surface during polishing.

The pH of the aqueous dispersion is preferably adjusted to the range of 2–12, more preferably 3–11, even more preferably 4–10. The pH adjustment may be accomplished with an acid such as nitric acid or sulfuric acid, or with an alkali such as potassium hydroxide, sodium hydroxide or ammonia. If the pH of the aqueous dispersion is lower than 2, the etching effect on working films of copper or the like is stronger, thus tending to produce more dishing and erosion. On the other hand, if the pH is above 12, interlayer insulating films are excessively polished, and a satisfactory wiring pattern cannot be obtained.

When the working film is composed of a metal, an oxidizing agent may be added to the aqueous dispersion within a range that does not cause excessive etching, to vastly improve the removal rate. As oxidizing agents there may be used those selected as appropriate depending on the electrochemical properties of the metal layer of the working surface, based on a Pourbaix diagram, for example.

As examples of specific oxidizing agents there may be mentioned hydrogen peroxide, organic peroxides such as peracetic acid, perbenzoic acid, tert-butylhydroperoxide, and the like, permanganate compounds such as potassium permanganate, and the like, bichromate compounds such as potassium bichromate, and the like, halogenate compounds such as potassium iodate, and the like, nitric compounds such as nitric acid, iron nitrate, and the like, perhalogenate compounds such as perchloric acid, and the like, transition metal salts such as potassium ferricyanide, and the like, persulfuric compounds such as ammonium persulfate, and the like, and heteropoly acids. Particularly preferred among these oxidizing agents are hydrogen peroxide and organic peroxides which contain no metals and whose decomposition products are harmless. Including such oxidizing agents can give an even more vastly improved removal rate.

The content of the oxidizing agent may be up to 5 parts, especially 0.01–3 parts and more preferably 0.05–2 parts, in 100 parts of the aqueous dispersion. Since sufficient improvement in the removal rate can be achieved if the oxidizing agent is added at 5 parts, there is no need to add it at greater than 5 parts.

Various additives may also be added to the aqueous dispersion as necessary in addition to the aforementioned oxidizing agents. This can further improve the stability of the dispersion, increase the polishing speed, and adjust the difference in polishing speeds when polishing films of different hardness, such as in the case of polishing two or more types of working films. Specifically, addition of an organic acid or inorganic acid can give a more highly stable aqueous dispersion. As organic acids there may be used formic acid, acetic acid, oxalic acid, malonic acid, succinic acid, benzoic acid, or the like. As inorganic acids there may be used nitric acid, sulfuric acid, phosphoric acid, or the like. Organic acids are particularly preferred as acids used to increase the stability. These acids can also be used to increase the removal rate.

Addition of these acids, or alkali metal hydroxides ammonia and the like for adjustment of the pH can improve the dispersability and stability of the aqueous dispersion.

As alkali metal hydroxides there may be used sodium hydroxide and potassium hydroxide mentioned above, as well as rubidium hydroxide, cesium hydroxide and the like. Adjustment of the pH of the aqueous dispersion can increase the removal rate, and the pH is preferably determined as appropriate within the range where the abrasive can exist stably in consideration of the electrochemical properties of the working surface, the dispersability and stability of the polymer particles and the removal rate.

The aqueous dispersion may also contain a polyvalent metal ion with the effect of promoting the function of the oxidizing agent such as hydrogen peroxide, and can thus further improve the removal rate.

As polyvalent metal ions there may be mentioned metal ions such as aluminum, titanium, vanadium, chromium, manganese, iron, cobalt, nickel, copper, zinc, germanium, zirconium, molybdenum, tin, antimony, tantalum, tungsten, lead and cerium. Any one of these may be used, or two or more polyvalent metal ions may be used in combination.

The polyvalent metal ion content may be up to 3000 ppm, and preferably from 10–2000 ppm, in the aqueous dispersion.

The polyvalent metal ion may be produced by mixing with the aqueous medium a salt such as a nitric acid salt, sulfuric acid salt or acetic acid salt or a chelate containing a polyvalent metal element, and it may also be produced by mixing an oxide of a polyvalent metal element. There may also be used a compound that produces a monovalent metal ion when mixed with the aqueous medium, but whose ion becomes a polyvalent metal ion by the oxidizing agent. Of these various salts and chelates, iron nitrate is preferred because of its particularly excellent effect of improving the removal rate.

By including an acid in the aqueous dispersion for chemical mechanical polishing of the invention, it is possible to further improve the dispersability, stability and removal rate. The acid is not particularly restricted, and any organic acid or inorganic acid may be used. As organic acids there may be mentioned para-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid. These organic acids may be used alone or in combinations of two or more. As inorganic acids there may be mentioned nitric acid, hydrochloric acid and sulfuric acid, and any one or more of these may be used. An organic acid and an inorganic acid may also be used in combination.

The contents of these acids may 0.01–5 parts, especially 0.1–3 parts and more preferably 0.3–2 parts in 100 parts of the aqueous dispersion. With an acid content within the range of 0.01–5 parts it is possible to provide an aqueous dispersion with excellent dispersability and sufficient stability, while it is also preferred from the standpoint of improving the removal rate.

PREFERRED EMBODIMENT OF THE INVENTION

The present invention will now be explained in greater detail by way of examples employing inorganic particles and composite particles.

[1] Production Example for Low Permittivity Porous Insulating Film (1) Preparation of Polysiloxane Sol A mixed solution comprising 101.5 g of methyltrimethoxysilane, 276.8 g of methyl methoxypropionate and 9.7 g of tetraisopropoxytitanium/ethyl acetoacetate chelate was heated to 60° C., and a mixture of 112.3 g of γ-butyrolactone and water (weight ratio: 4.58) was added to the mixed solution dropwise over an hour. After completion of the dropwise addition of the mixture, reaction was conducted at 60° C. for one hour to obtain a polysiloxane sol.

(2) Production of Insulating Film

After mixing 15 g of the polysiloxane sol obtained in (1) with 1 g of polystyrene particles, the mixture was coated onto an ITO wafer by spin coating to form a coating with a thickness of 1.39 µm. This was heated at 80° C. for 5 minutes and then at 200° C. for 5 minutes, and then heated at 340° C., 360° C. and 380° C. for 30 minutes each in that order under vacuum and finally heated at 450° C. for one hour to form a colorless transparent film.

Observation of a cross-section of the film with a scanning electron microscope confirmed formation of fine pores. The permittivity was 1.98, the elastic modulus was 3 GPa, and the void volume was 15%.

[2] Preparation of Aqueous Dispersion Containing Abrasive (1) Preparation of Aqueous Dispersion Containing Fumed Silica After placing 100 g of fumed silica particles (product name: "Aerosil #90", Nihon Aerosil Co., Ltd.) in a 2-liter volume polyethylene bottle, ion-exchange water was added to a total amount of 1000 g. The particles were then dispersed with an ultrasonic disperser to prepare an aqueous dispersion containing 10 parts of fumed silica particles.

(2) Preparation of Aqueous Dispersion Containing Colloidal Silica

After loading 70 g of 25 wt % ammonia water, 40 g of ion-exchange water, 175 g of ethanol and 21 g of tetraethoxysilane into a 2-liter volume flask, the mixture was heated to 60° C. while stirring at 180 rpm, and after continuing the stirring at this temperature for 2 hours, the mixture was cooled to obtain a colloidal silica/alcohol dispersion with a mean particle size of 0.23 µm. An evaporator was then used for several repetitions of a procedure in which the alcohol portion was removed while adding ion-exchange water to the dispersion at a temperature of 80° C., and the alcohol in the dispersion was thereby removed to prepare an aqueous dispersion with a solid concentration of 8 wt %.

(3) Preparation of Aqueous Dispersion Containing Composite Particles

{1} Aqueous Dispersion Containing Polymer Particles

After charging 90 parts of methyl methacrylate, 5 parts of methoxypolyethyleneglycol methacrylate (trade name: "NK Ester M-90G", #400, product of Shinnakamura Chemical Industries Co., Ltd.), 5 parts of 4-vinylpyridine, 2 parts of an azo-based polymerization initiator (trade name "V50", product of Wako Junyaku Co., Ltd.) and 400 parts of ion-exchange water into a 2-liter volume flask, the contents were heated to 70° C. while stirring under a nitrogen gas atmosphere, for 6 hours of polymerization. This yielded an aqueous dispersion containing polymethyl methacrylate-based particles with a mean particle size of 0.15 µm, having amino group cations and functional groups having polyethylene glycol chain. The polymerization yield was 95%.

{2} Aqueous Dispersion Containing Composite Particles

After loading 100 parts of this aqueous dispersion containing 10 wt % polymethyl methacrylate-based particles which was obtained in {1} above into a 2-liter volume flask, 1 part of methyltrimethoxysilane was added and the mixture was stirred at 40° C. for 2 hours. The pH was then adjusted to 2 with nitric acid to obtain aqueous dispersion (a). Also, the pH of an aqueous dispersion containing 10 wt % of colloidal silica particles (product name: "Snowtex O", product of Nissan Chemical Industries Co., Ltd.) was adjusted to 8 with potassium hydroxide to obtain aqueous dispersion (b). The zeta potential of the polymethyl methacrylate-based particles in aqueous dispersion (a) was +17 mV, and the zeta potential of the silica particles in aqueous dispersion (b) was −40 mV.

After then gradually adding 50 parts of aqueous dispersion (b) to 106 parts of aqueous dispersion (a) over a period of 2 hours and then mixing and stirring for 2 hours, there was obtained an aqueous dispersion containing particles consisting of silica particles adhered to the polymethyl methacrylate-based particles. Next, 2 parts of vinyltriethoxysilane was added to this aqueous dispersion, and after stirring for one hour, 1 part of tetraethoxysilane was added, and the mixture was heated to 60° C. and then continually stirred for 3 hours and cooled to obtain an aqueous dispersion containing composite particles. The mean particle size of the composite particles was 180 nm, and the silica particles were adhered to 80% of the surface of the polymethyl methacrylate-based particles.

[3] Preparation of Aqueous Dispersion for Chemical Mechanical Polishing and Evaluation of Polishing Rate and Presence of Scratches

EXAMPLE 1

The composite particle-containing aqueous dispersion prepared in [2], (2) above was added to ion-exchange water to a composite particle content of 5 parts and to a 0.005 wt % concentration of a non-ionic surfactant (product name: "Emulgen-120", Kao Corporation.) and then the pH was adjusted to 9 with potassium hydroxide to obtain an aqueous dispersion for CMP.

A copper film formed on an 8-inch thermal oxidation film-coated silicon wafer (film thickness: 15,000 Å) was set in a CMP apparatus. (Model "LPG510", product of Lapmaster SFT Corp.), and a porous polyurethane polishing pad (product name: "IC1000" by Rodel-Nitta Corp.) was used for 1 minute of polishing using the above-mentioned aqueous dispersion for CMP, with the load at 0.03 MPa. After polishing, the copper film thickness was measured with an electric conducting film thickness meter, and the removal rate was calculated. An insulating film was also formed on a silicon substrate in the same manner as [1], (2), and after polishing, washing and drying under the same conditions, the total number of scratches (Kt) produced on the entire polishing surface (this area is represented as "St", units: $mm^2$) was measured with a non-patterned wafer surface matter scanning apparatus (Model "Surfacescan SP1", product of KLA Tencor Co., Ltd.), and the number of scratches per unit area ($10^{-2}$ $mm^2$, 100×100 µm square region) was calculated according to the formula given below. Number of scratches per unit area=Kt/(St/$10^{-2}$)

The removal rate of the insulating film was calculated from measurement of the film thickness before and after polishing, using an optical interference film thickness probe (Model "FTP500" by Sentech Corp.).

EXAMPLES 2–9

Aqueous dispersions for CMP with a pH of 9 were obtained in the same manner as Example 1, except that the types and contents of abrasive and the contents of scratch inhibitors were as shown in Table 1 and Table 2. In Table 1, the "HMT" in the scratch inhibitor column is 7-hydroxy-5-methyl-1,3,4-triazaindolizine, and the "AT" is 5-amino-1H-tetrazole. In Examples 3 and 4, 0.005 wt % Emulgen-120 and 0.2 wt % HMT were used together for the scratch inhibitor, in Example 7, 0.005 wt % of Emulgen-120 and 0.2 wt % AT were used together for the scratch inhibitor, and in Example. 8, 0.01 wt % of Emulgen-120 and 0.1 wt % HMT were used together. Furthermore, in Example 4, 0.1 wt % hydrogen peroxide was also included as an oxidant.

The aqueous dispersions of Examples 2 to 9 were used for polishing of copper-coated wafers and insulating films formed on silicon substrates (indicated as "LKD" in Table 1) in the same manner as Example 1, and the removal rates and number of scratches were evaluated.

The results are summarized in Table 1 and Table 2.

According to the results in Table 1 and Table 2, the aqueous dispersions of Examples 1 to 9 that contained prescribed amounts of scratch inhibitors had absolutely no scratches or very few scratches on the LKD surface.

(3) 2-vinylpyridine and 4-vinylpyridine, (4) salicylaldoxime, (5) o-phenylenediamine and m-phenylenediamine, (6) catechol, (7) o-aminophenol, (8) thiourea, (9) an N-alkyl group-containing (meth)acrylamide, (10) an N-aminoalkyl group-containing (meth)acrylamide, (11) a heterocyclic compound with a heteropentacycle and with no aromatic ring forming the skeleton, (12) a heterocyclic compound with a heteropentacycle and with an aromatic ring forming the skeleton, (13) phthalazine, (14) a compound with a heterohexacycle bearing three nitrogen atoms and a derivative of any of compounds (1) through (14), and (15) a surfactant;

each of said organic/inorganic composite particles comprises an organic particle and a coating of inorganic particles on said organic particle;

a zeta potential of said organic particle is opposite in sign to a zeta potential of each of said inorganic particles; and said organic particle and said inorganic particles are bonded together by electrostatic force.

TABLE 1

| | | Examples | | | | | | |
|---|---|---|---|---|---|---|---|---|
| | | 1 | 2 | 3 | 4 | 5 | 6 | 7 |
| Abrasive | Type | Composite particles | | | | Fumed silica | | Composite particles |
| | Content (Parts) | 5 | | | | 5 | | 5 |
| Scratch Inhibitor | Type | Emulgen-120 | HMT | Emulgen-120 + HMT | | Emulgen-120 | HMT | Emulgen-120 + AT |
| | Content (wt %) | 0.005 | 0.2 | 0.005/0.2 | | 0.005 | 0.2 | 0.005/0.2 |
| Hydrogen peroxide (wt %) | | — | — | — | 0.1 | — | — | — |
| pH | | 9 | | | | | | |
| pH adustor | | KOH | | | | | | |
| Copper removal rate (Å/min) | | 270 | 230 | 255 | 125 | 130 | 135 | 15 |
| LKD | Removal rate (Å/min) | <1 | 30 | 35 | 30 | 80 | 70 | 40 |
| | Number of scratches | 1 | | 0 | | 2 | 3 | 0 |

TABLE 2

| | | Examples | |
|---|---|---|---|
| | | 8 | 9 |
| Abrasive | Type | Colloidal silica | Composite particles |
| | Content (Parts) | 5 | 5 |
| Scratch Inhibitor | Type | Emulgen-120 + HMT | HMT |
| | Content (wt %) | 0.01/0.1 | 0.1 |
| Hydrogen peroxide (wt %) | | — | — |
| pH | | 7 | 7 |
| pH adjustor | | KOH | KOH |
| Copper removal rate (Å/min) | | 120 | 115 |
| LKD | Removal rate (Å/min) | 25 | 20 |
| | Number of scratches | 0 | 0 |

What is claimed is:

1. A chemical mechanical polishing process comprising: polishing of an interlayer insulating film with an elastic modulus of no greater than 20 GPa as measured by the nanoindentation method, using an aqueous dispersion which comprises a scratch inhibitor and an abrasive comprising organic/inorganic composite particles, wherein said scratch inhibitor is at least one compound selected from the group consisting of (1) biphenol, (2) bipyridyl, 2. The chemical mechanical polishing process according to claim 1, wherein said scratch inhibitor is a non-ionic surfactant which is one selected from the group consisting of polyoxyethylene alkyl ether, polyoxyethylene ether of glycerin ester, polyethylene glycol fatty acid ester, glycerin ester and sorbitan ester.

3. The chemical mechanical polishing process according to claim 1, wherein said scratch inhibitor is 7-hydroxy-5-methyl-1,3,4-triazaindolizine.

4. The chemical mechanical polishing process according to claim 1, wherein said scratch inhibitor comprises a combination of a compound selected from the group consisting of 7-hvdroxy-5-methyl-1,3,4-triazaindolizine and 5-amino-1H-tetrazole, and a non-ionic surfactant.

5. The chemical mechanical polishing process according to claim 1, wherein said scratch inhibitor is a surfactant which is present in an amount of from 0.0001 to 0.1 wt %, and another scratch inhibitor, other than the surfactant, present in an amount of from 0.001 to 5 wt %, based on the weight of the aqueous dispersion.

6. The chemical mechanical polishing process according to claim 1, wherein said abrasive is present in an amount of from 0.1 to 20 parts by weight, based on 100 parts of the aqueous dispersion.

7. The chemical mechanical polishing process according to claim 1, wherein said aqueous dispersion has a pH of from 2 to 12.

8. The chemical mechanical polishing process according to claim 1, wherein said organic particle comprises at least one polymer selected from the group consisting of polystyrene, styrene-based copolymers, (meth)acrylic resins, acrylic-based copolymers, polyvinyl chloride, polyacetals, saturated polyesters, polyamides, polyimides, polycarbonates, phenoxy resins, polyolefins and olefin-based copolymers.

9. The chemical mechanical polishing process according to claim 1, wherein said abrasive consists of at least one selected from the group consisting of said organic/inorganic composite particle and organic particles.

10. The chemical mechanical polishing process according to claim 1, wherein said abrasive consists of said organic/inorganic composite particle.

11. The chemical mechanical polishing process according to claim 1, wherein said aqueous dispersion further comprises an oxidizing agent.

12. The chemical mechanical polishing process according to claim 11, wherein said oxidizing agent is hydrogen peroxide.

13. The chemical mechanical polishing process according to claim 11, wherein said aqueous dispersion further comprises an organic acid.

14. The chemical mechanical polishing process according to claim 11, wherein said oxidizing agent is present in an amount of from 0.01 to 3 parts by weight, based on 100 parts of the aqueous dispersion.

* * * * *